United States Patent
Hong

(10) Patent No.: US 7,471,136 B2
(45) Date of Patent: Dec. 30, 2008

(54) TEMPERATURE COMPENSATED SELF-REFRESH CIRCUIT

(75) Inventor: Yun Seok Hong, Gyeonggi-do (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/148,562

(22) Filed: Jun. 9, 2005

(65) Prior Publication Data
US 2006/0066386 A1 Mar. 30, 2006

(30) Foreign Application Priority Data
Sep. 24, 2004 (KR) .................. 10-2004-0077110

(51) Int. Cl.
*H01L 35/00* (2006.01)
*H01L 37/00* (2006.01)
*H03K 3/42* (2006.01)

(52) U.S. Cl. .................................... 327/513
(58) Field of Classification Search ......... 327/512–513, 327/539
See application file for complete search history.

(56) References Cited

U.S. PATENT DOCUMENTS 5,852,376 A * 12/1998 Kraus .................. 327/143
6,204,724 B1 * 3/2001 Kobatake .............. 327/541
6,628,558 B2 * 9/2003 Fiscus .................. 365/222
7,135,913 B2 * 11/2006 Min et al. ............. 327/541

FOREIGN PATENT DOCUMENTS

JP   2000075947 A   *  3/2000

* cited by examiner

*Primary Examiner*—Quan Tra
(74) *Attorney, Agent, or Firm*—Townsend & Townsend and Crew LLP

(57) ABSTRACT

A temperature compensated self-refresh circuit maintains a stable current characteristic by maintaining a predetermined self-refresh cycle to cope with a process skew and a voltage change in a low power consumption memory product and by changing the self-refresh cycle only depending on temperature change. The temperature compensated self-refresh circuit is provided with a reference voltage generating unit adapted and configured to use an internal power voltage of a Widlar type so as to reduce a process skew and to have NMOS transistors with a LVT (Low Voltage Transistor) structure so as to have the same voltage as that of a temperature sense unit, thereby maintaining a predetermined cycle of an oscillating signal coping with the process skew.

5 Claims, 5 Drawing Sheets

TEMPERATURE COMPENSATED SELF-REFRESH CIRCUIT

BACKGROUND OF THE INVENTION

1. Field of the Invention

The present invention generally relates to a temperature compensated self-refresh circuit, and more specifically, to a technology of changing a self-refresh cycle depending on temperature in a low power semiconductor memory product to generate a stable refresh cycle corresponding to a process skew and an external power.

2. Background of the Related Art

In general, a self-refresh operation means that a semiconductor memory device such as a DRAM (Dynamic Random Access Memory) performs a refresh operation automatically with a predetermined cycle (basic cycle) at a standby mode in order to maintain data stored in a memory cell.

Since a refresh cycle is determined in case that temperature is high in a self-refresh mode, it is not necessary to consider that a refresh cycle becomes longer when temperature is low. However, unnecessary current is consumed because the refresh cycle is generated as it is when temperature is high.

FIG. 1 is a circuit diagram illustrating a conventional temperature compensated self-refresh circuit that senses temperature change in a chip to regulate a self-refresh cycle automatically.

The conventional temperature compensated self-refresh circuit comprises a comparison unit 1, a reference voltage generating unit 2, a logic unit 3 and a temperature sense unit 4.

Here, the comparison unit 1 comprises PMOS transistors P1, P2, NMOS transistors N1~N3, and capacitors C1, C2. A common gate of the PMOS transistors P1 and P2 is connected to a drain of the PMOS transistor P2, and a power voltage V is applied through a common source.

The NMOS transistor N1, which is connected between the PMOS transistor P1 and the NMOS transistor N3, has a gate connected a node (A). The NMOS transistor N2, which is connected between the PMOS transistor P2 and the NMOS transistor N3, has a gate connected to a node (B). The NMOS transistor N3, which is connected between the NMOS transistors N1, N2 and a ground voltage terminal, has a gate to receive a control signal VLR.

The capacitor C1 is connected between the node (A) and the ground voltage terminal, and the capacitor C2 is connected between the node (B) and the ground voltage terminal.

The reference voltage generating unit 2 comprises NMOS transistors N4 and N5 which are connected serially between the power voltage V terminal and the ground voltage terminal. The NMOS transistor N4, which is connected between the power voltage V terminal and the node (B), has a gate connected in common to a source. The NMOS transistor N5, which is connected between the node (B) and the ground voltage terminal, has a gate connected to the node (B).

The logic unit 3 comprises inverters IV1~IV4, and a NAND gate ND1. The inverters IV1~IV3 invert and delay an output signal from the comparison unit 1. The NAND gate ND1 performs a NAND operation on a temperature sense operation signal TEMPON, an oscillating strobe signal TOSCRSTB and an output signal from the inverter IV3. The inverter IV4 inverts an output signal from the NAND gate ND1.

The temperature sense unit 4 comprises PMOS transistors P3, P4, NMOS transistors N6~N8, and an inverter IV5.

The PMOS transistor P3, which is connected between the power voltage V terminal and a source of the NMOS transistor N6, has a gate to receive an output signal from the inverter IV4. The PMOS transistor P4, which is connected between the power voltage V terminal and the node (A), has a gate to receive the output signal from the inverter IV4.

The NMOS transistors N6~N8 are connected serially between the node (A) and the ground voltage terminal. A gate of the NMOS transistor N6 is connected to the node (A), and a drain of the NMOS transistor N7 is connected in common to a gate of the NMOS transistor N7. A gate of the NMOS transistor N8 is connected to the output signal from the inverter IV4. The inverter IV5 inverts an output signal from the inverter IV4 to output the oscillating signal TEMPOSC.

Hereinafter, the operation of the conventional temperature compensated self-refresh circuit is described with reference to FIG. 2 that shows a voltage waveform diagram.

When the temperature sense operation signal TEMPON is applied, the node (A) transits from a power voltage level (1.5V) to a floating state. As a result, current applied to the node (A) flows through the NMOS transistors N6 and N7, which are connected with a diode type, into the ground voltage terminal.

Thereafter, when the node (A) is below a voltage level (0.75V) of the node (B) which is a reference voltage of the comparison unit 1, the oscillating signal TEMPOSC is outputted with a high pulse.

Here, when temperature rises, a threshold voltage of the NMOS transistors N6 and N7 which are a double structured diode type becomes lower. As a result, while current rises, the voltage level of the node (A) reaches rapidly a reference voltage level of the comparison unit 1, so that the oscillating signal TEMPOSC is outputted with a high pulse. Thus, as temperature becomes higher, a cycle of the oscillating signal TEMPOSC becomes faster.

However, in the conventional temperature compensated self-refresh circuit, the threshold voltage and the current of the NMOS transistors N6 and N7 are both changed as a process skew is varied. As a result, when the diode of the NMOS transistors N6 and N7 is a double structure by change of the process skew, a voltage change of $2*\Delta V$ is generated, so that the cycle of the oscillating signal TEMPOSC makes a difference of more than 7 times.

In order to reduce a process skew in the conventional temperature compensated self-refresh circuit, a circuit which employs a reference voltage VDL_S with a Widlar type in the reference voltage generating unit 2 has been disclosed. This conventional circuit supplies the predetermined reference voltage VDL_S generated internally in the node (B) to reduce a voltage change of $2*\Delta V - \Delta V = \Delta V$.

However, as shown in FIG. 3, when processes of a NMOS transistor and a PMOS transistor are SS and FF, voltage change of the Widlar type is actually reduced, but voltage change in SF and FS becomes larger.

That is, in the conventional temperature compensated self-refresh circuit, the voltage change becomes larger because the skew is changed depending on the processes of the PMOS transistor and the NMOS transistor. As a result, a self-refresh cycle of the conventional circuit is changed depending on the process skew and the voltage change.

SUMMARY OF THE INVENTION

Various embodiments of the present invention are directed at maintaining a predetermined self-refresh cycle to cope with a process skew and voltage change in a low power consumption memory product, thereby reducing current consumption.

According to one embodiment of the present invention, a temperature compensated self-refresh circuit comprises a comparison unit adapted and configured to compare a reference voltage with a voltage varied depending on temperature change and to output a signal corresponding to the comparison result, a logic unit adapted and configured to delay an output signal from the comparison unit when a temperature sense operation signal is activated and to control generation of an oscillating signal, a temperature sense unit adapted and configured to output the voltage varied depending on temperature change to the comparison unit, and a reference voltage generating unit adapted and configured to be driven in response to a constant internal power voltage applied when a power-up signal is activated and to generate the reference voltage having the same voltage as that of the temperature sense unit to the comparison unit.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
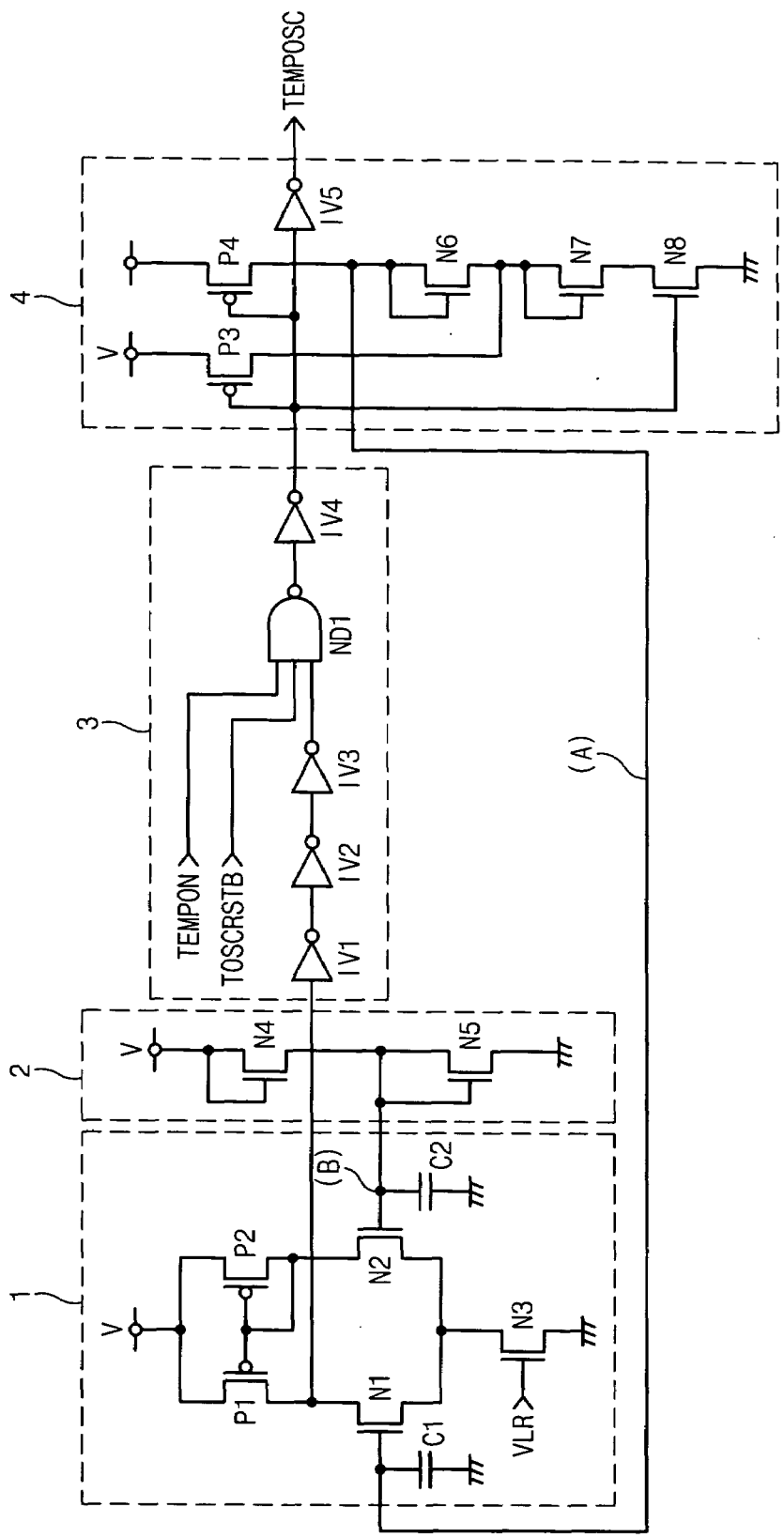
FIG. 1 is a circuit diagram illustrating a conventional temperature compensated self-refresh circuit.
Figure 2:
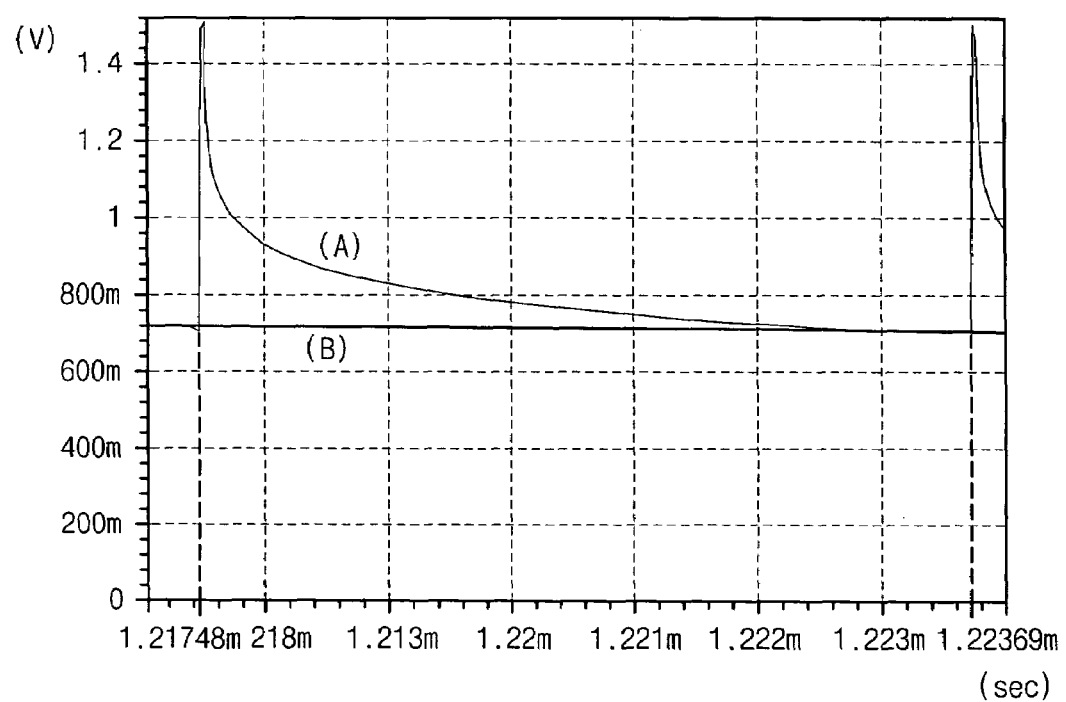
FIG. 2 is a voltage waveform diagram of each node shown in FIG. 1.
Figure 3:
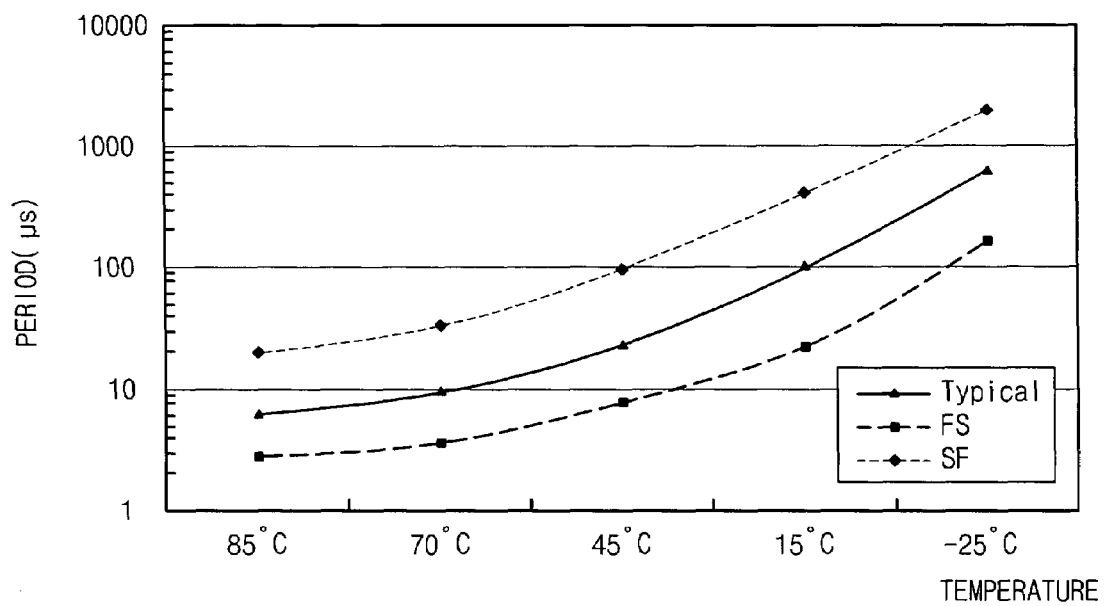
FIG. 3 is a simulation diagram illustrating the operation of the conventional temperature compensated self-refresh circuit.
Figure 4:
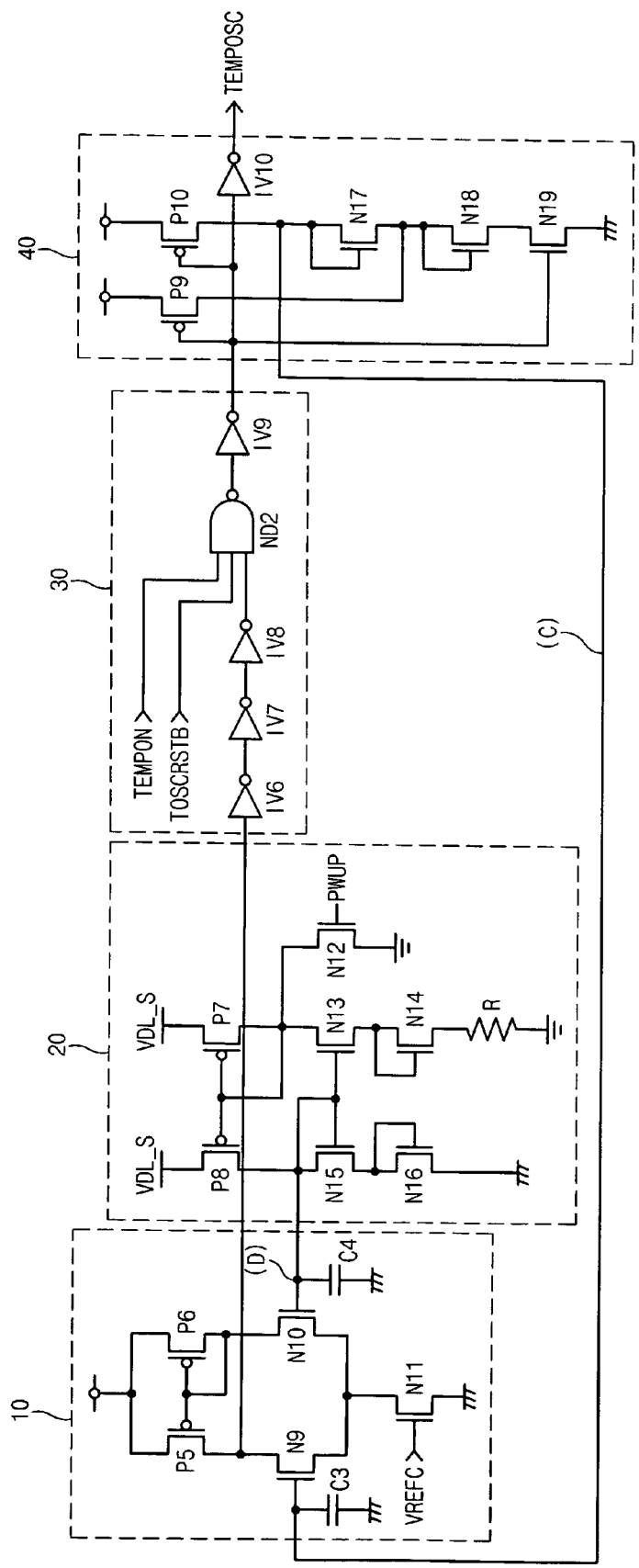
FIG. 4 is a circuit diagram illustrating a temperature compensated self-refresh circuit according to an embodiment of the present invention.

FIG. 4 is a circuit diagram illustrating a temperature compensated self-refresh circuit according to an embodiment of the present invention.

In this embodiment, the temperature compensated self-refresh circuit comprises a comparison unit 10, a reference voltage generating unit 20, a logic unit 30 and a temperature sense unit 40.

Here, the comparison unit 10 compares a reference voltage with an output voltage of the temperature sense unit 40 to output a high or low level signal corresponding to the comparison result. The reference voltage generating unit 20 generates a reference voltage so as to have the same voltage change as that of the temperature sense unit 40.

The logic unit 30 inverts and delays an output signal from the comparison unit 10 to control a pulse width of an oscillating signal TEMPOSC. The logic unit 30 controls generation of the oscillating signal TEMPOSC in response to an oscillating strobe signal TOSCRSTB, a temperature sense operation signal each which have a predetermined cycle regardless of temperature change and the output signal from comparison unit 10. The temperature sense unit 40 outputs a voltage varied depending on the temperature change to the comparison unit 10.

To more fully illustrate this configuration, the comparison unit 10 comprises PMOS transistors P5, P6, NMOS transistors N9~N11, and capacitors C3, C4. A common gate of the PMOS transistors P5 and P6 is connected to a drain of the PMOS transistor P6, and the power voltage V is applied through a common source.

The NMOS transistor N9, which is connected between the PMOS transistor P5 and the NMOS transistor Nil, has a gate connected to a node (C). The NMOS transistor N10, which is connected between the PMOS transistor P6 and the NMOS transistor N11, has a gate connected to a node (D). The NMOS transistor N11, which is connected between the NMOS transistors N9, N10 and a ground voltage terminal, has a gate to receive a control signal VREFC.

The capacitor C3 is connected between the node (C) and the ground voltage terminal, and the capacitor C4 is connected between the node (D) and the ground voltage terminal.

The reference voltage generating unit 20 comprises PMOS transistors P7, P8, NMOS transistors N12~N16, and a resistor R.

A common gate of the PMOS transistor P7 and P8 is connected to a drain of the PMOS transistor P7, and the internal power voltage VDL_S is applied through a common source. The NMOS transistor N12, which is connected between the PMOS transistor P7 and the ground voltage terminal, has a gate to receive a power-up signal PWUP.

The NMOS transistors N13 and N14, which are connected serially between the PMOS transistor P7 and the resistor R, form a LVT (Low voltage Transistor) structure. Here, the NMOS transistor N13 is connected in common to a gate of the NMOS transistor N15. The NMOS transistor N14 has a diode structure where a gate is connected in common to a drain. The resistor R is connected between the NMOS transistor N14 and the ground voltage terminal.

The NMOS transistors N15 and N16 are connected serially between the PMOS transistor P8 and the ground voltage terminal. Here, a gate of the NMOS transistor N15 is connected in common to a drain of the NMOS transistor N15. The NMOS transistor N16 has a diode structure where a gate is connected in common to a drain. A common drain of the PMOS transistor P8 and the NMOS transistor N15 is connected to the node (D).

The logic unit 30 comprises inverters IV6~IV9, and a NAND gate ND2. The inverters IV6~IV8 invert and delay the output signal from the comparison unit 10 to maintain a pulse width of the oscillating signal TEMPOSC for a predetermined period. The NAND gate ND2 performs a NAND operation on the temperature sense operation signal TEMPON, the oscillating strobe signal TOSCRSTB having a predetermined cycle regardless of temperature change and an output signal from the inverter IV8. The inverter IV9 inverts an output signal from the NAND gate ND4.

The temperature sense unit 40 comprises PMOS transistors P9, P10, NMOS transistors N17~N19, and an inverter IV10.

The PMOS transistor P9, which is connected between the voltage V terminal and a source of the NMOS transistor N17, has a gate to receive an output signal from the inverter IV9. The PMOS transistor P10, which is connected between the power voltage V terminal and the node (C), has a gate to receive an output signal from the inverter IV9.

The NMOS transistors N17~N19 are connected serially between the node (C) and the ground voltage terminal. A gate of the NMOS transistor N17 is connected to the node (C), and a drain of the NMOS transistor N18 is connected in common to a gate. A gate of the NMOS transistor N19 is connected to an output signal from the inverter IV9. The inverter IV10 inverts an output signal from the inverter IV9 to output the oscillating signal TEMPOSC.

In the above-described circuit according to the embodiment of the present invention, current flowing in the NMOS transistors N17 and N18 which are serially connected with a diode structure in the temperature sense unit 40 is differentiated depending on change of temperature. Additionally, the comparison unit 10 compares an output signal from the node (D) with a voltage variably varied depending on temperature through the NMOS transistors N17 and N18, so that the oscillating signal TEMPOSC is generated to have a variable cycle depending on temperature change.

The detailed operation of the above-described process is described with reference to a simulation diagram of FIG. 5.

The reference voltage generating unit 20 supplies a ground voltage to a gate of the PMOS transistors P7, P8 when the power-up signal PWUP is activated to turn on the NMOS transistor N12.

Then, the PMOS transistors P7, P8 are turned on, and the predetermined internal power voltage VDL_S is supplied to the node (D). The NMOS transistors N13~N16 are all turned on to regulate a voltage applied to the node (D) and to trim a basic cycle of the oscillating signal TEMPOSC finally outputted through regulation of a value of the resistor R.

Meanwhile, since the temperature sense operation signal TEMPON is inactivated to a low level before a temperature compensated operation is operated, the PMOS transistor P10 is turned on to precharge a voltage of the node (C) to a power voltage level (1.5V). Then, the capacitor C3 of the comparison unit 10 is charged to a power voltage level.

Thereafter, when the temperature sense operation signal TEMPON is activated, an output signal of the logic unit 30 transits to 'high'. Thus, the PMOS transistors P9 and P10 are turned off, and the NMOS transistor N19 is turned on, so that the temperature sense unit 40 performs the temperature compensated operation.

Then, when the PMOS transistors P9 and P10 are turned off, the node (C) transits from the power voltage level (1.5V) to a floating state, so that a voltage drop occurs. A current applied to the node (C) flows through the NMOS transistors N17 and N18 connected with a diode structure into the ground voltage terminal. Here, the degree of the voltage drop generated in the node (C) is determined by the amount of current flowing in the NMOS transistors N17 and N18.

Next, a voltage of the capacitor C3 starts to be discharged by the voltage drop of the node (C). Here, the comparison unit 10 compares the voltage of the node (C) with the reference voltage of the node (D) to output a high or low level signal corresponding to the comparison result. That is, when a voltage level of the node (C) is below a reference voltage level of the node (D) in the comparison unit 10, the oscillating signal TEMPOSC is outputted with a high pulse.

Here, a threshold voltage of the NMOS transistors N15 and N16 connected with a double diode structure becomes lower when temperature rises. As a result, while current rises, the voltage level of the node (C) rapidly reaches the reference voltage level of the comparison unit 10, so that the oscillating signal TEMPOSC is outputted with a high pulse.

As a result, as temperature becomes higher, the cycle of the oscillating signal TEMPOSC is controlled to become faster and as temperature becomes lower, the cycle of the oscillating signal TEMPOSC is controlled to become slower by using the amount of current flowing in the diode which is differentiated depending on temperature.

At this time, as the process skew is changed, the threshold voltage and current of the NMOS transistors N17 and N18 connected with a diode structure are all varied. Also, the change of the process skew causes a voltage change of 2*ΔV in the double structured NMOS transistors N17 and N18.

However, a voltage change on the process skew does not occur in the embodiment of the present invention because the NMOS transistors N13, N14 and N15 and N16 of the reference voltage generating unit 20 have the same voltage change of 2*ΔV as that of the NMOS transistors N17, N18.

That is, the reference voltage generating unit 20 uses the internal power voltage VDL_S with the Widlar type in order to reduce the process skew. The reference voltage generating unit 20 comprises NMOS transistors N13, N14 and N15, and N16 to have a LVT structure. Here, the double structured NMOS transistors N13, N14 and N15, N16 are configured to have the same voltage change of 2*ΔV as that of the NMOS transistors N17, N18 connected with the diode structure in the temperature sense unit 40.

Figure 5:
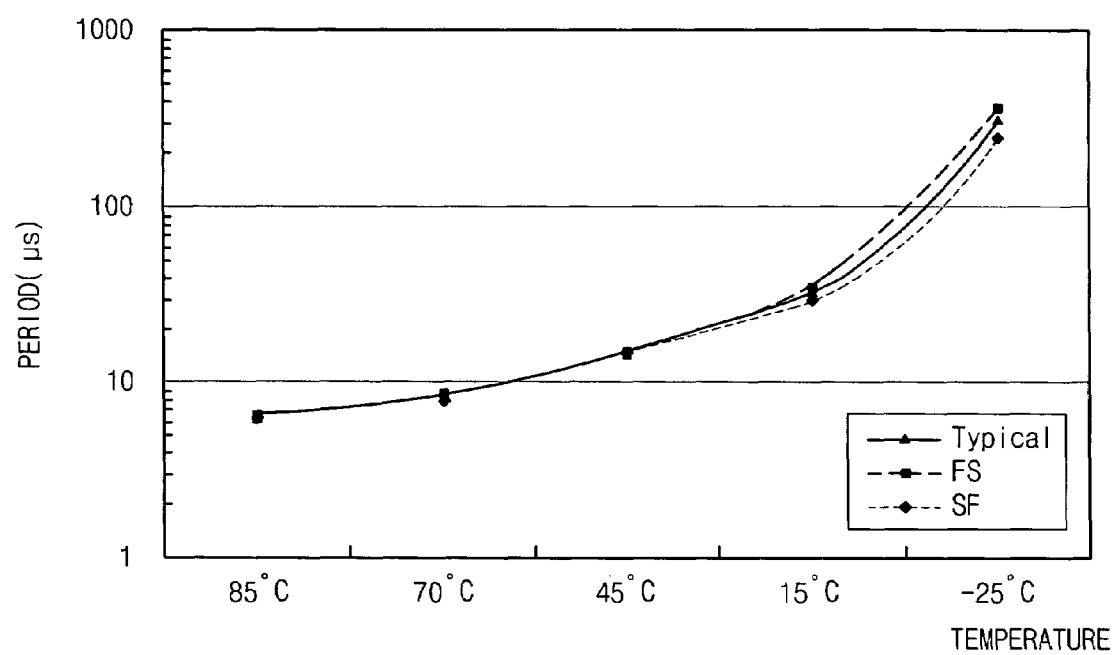
FIG. 5 is a simulation diagram illustrating the operation of the temperature compensated self-refresh circuit according to an embodiment of the present invention.

A simulation diagram of FIG. 5 shows a simulated result of the cycle of the oscillating signal TEMPOSC while the temperature of the circuit is changed into −25° C., 15° C., 45° C., 70° C., 85° C. when the constant internal power voltage VDL_S is applied.

As shown in FIG. 5, it is known that the self-refresh cycle is varied only by the temperature change. Instead, the self-refresh cycle is not varied by change in the process and the voltage but constantly maintained in the embodiment of the present invention.

The change of the self-refresh cycle by the process skew can be reduced into less than 5%, and also the change of the self-refresh cycle by the voltage can be reduced into less than 10%.

As a result, in the embodiment of the present invention, the constant self-refresh cycle is maintained to cope with the process skew and the voltage change, and a stable current characteristic can be maintained by changing the self-refresh cycle depending on temperature change.

As described above, in an embodiment of the present invention, the consumption of current IDD6 can be reduced by maintaining a predetermined self-refresh cycle to cope with a process skew and a voltage change in a low power consumption memory product and by changing the self-refresh cycle only depending on temperature change.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A temperature compensated self-refresh circuit comprising:
a comparison unit adapted and configured to compare a reference voltage with a voltage varied depending on temperature change and to output a signal corresponding to the comparison result;
a logic unit adapted and configured to delay an output signal from the comparison unit when a temperature sense operation signal is activated and to control generation of an oscillating signal;
a temperature sense unit adapted and configured to output the voltage varied depending on temperature change to the comparison unit, and the temperature sense unit including a first MOS diode unit whose threshold voltage changes according to temperature change and according to process skew; and a reference voltage generating unit adapted and configured to be driven in response to a constant internal power voltage applied when a power-up signal is activated and to generate the reference voltage having the same voltage change as that caused by process skew in the temperature sense unit and to output the reference voltage to the comparison unit and the reference voltage generating unit including a second diode unit whose threshold voltage changes as same as that of the first diode unit according to the process skew, wherein the second diode unit comprises a low voltage transistor unit, wherein the low voltage transistor unit comprises, a first NMOS transistor and a second NMOS transistor whose switching operations are controlled in response to the internal power voltage applied through a common gate; and the second diode unit including a first MOS diode and a second MOS diode provided between the first NMOS transistor, the second NMOS transistor and a ground voltage terminal, and configured to generate the reference voltage.

2. The temperature compensated self-refresh circuit according to claim 1, wherein the reference voltage generating unit further comprises:

a first driving element adapted and configured to supply a ground voltage when the power-up signal is activated; and a driving unit adapted and configured to be turned on in response to the ground voltage applied from the first driving element and to supply the internal power voltage.

3. The temperature compensated self-refresh circuit according to claim 2, wherein the first driving element comprises a first NMOS transistor adapted and configured to be connected between the ground voltage terminal and the driving unit and to have a gate which receives the power-up signal.

4. The temperature compensated self-refresh circuit according to claim 2, wherein the driving unit comprises a first PMOS transistor and a second PMOS transistor that are adapted and configured to selectively supply the internal power voltage in response to the ground voltage applied through a common gate.

5. The temperature compensated self-refresh circuit according to claim 1, wherein the low voltage transistor unit further comprises a resistor adapted and configured to be connected between the first MOS diode and the ground voltage terminal.

* * * * *